United States Patent
Lin et al.

(10) Patent No.: US 6,829,166 B2
(45) Date of Patent: Dec. 7, 2004

(54) METHOD FOR CONTROLLING A NON-VOLATILE DYNAMIC RANDOM ACCESS MEMORY

(75) Inventors: Yen-Tai Lin, Hsin-Chu (TW); Shih-Jye Shen, Hsin-Chu (TW)

(73) Assignee: eMemory Technology Inc., Hsin-Chu (TW)

( * ) Notice: Subject to any disclaimer, the term of this patent is extended or adjusted under 35 U.S.C. 154(b) by 120 days.

(21) Appl. No.: 10/065,042

(22) Filed: Sep. 13, 2002

(65) Prior Publication Data

US 2004/0052112 A1 Mar. 18, 2004

(51) Int. Cl.[7] .............................................. G11C 16/04
(52) U.S. Cl. ............................. 365/185.18; 365/185.01
(58) Field of Search ...................... 365/185.18, 185.26, 365/185.27, 185.01, 102, 103

(56) References Cited

U.S. PATENT DOCUMENTS

| 4,055,837 A | 10/1977 | Stein et al. | |
|---|---|---|---|
| 4,449,205 A | 5/1984 | Hoffman | |
| 5,063,425 A | * 11/1991 | Yamauchi et al. | .......... 257/298 |
| 5,375,083 A | * 12/1994 | Yamaguchi | ............ 365/185.27 |

FOREIGN PATENT DOCUMENTS

| JP | 59221893 | 12/1984 |
|---|---|---|
| JP | 08107156 | 4/1996 |
| TW | 395056 | 6/2000 |

* cited by examiner

*Primary Examiner*—Thong Q. Le
(74) *Attorney, Agent, or Firm*—Winston Hsu

(57) ABSTRACT

A method for controlling a non-volatile dynamic random access memory provides a non-volatile dynamic random access memory having a storage unit and a control unit. The storage unit has a floating gate for storing charges and a control gate for receiving an operating voltage to determine whether a channel is induced on the surface of a substrate. The channel corresponds to a number of charges stored on the floating gate. A parasitic capacitor exists between the storage unit and the control unit, and a capacitance of the parasitic capacitor increases when the channel has been induced. The method includes applying a first predetermined voltage to the control unit and measuring a voltage variance generated by the parasitic capacitor to analyze data stored by the storage unit.

21 Claims, 4 Drawing Sheets

METHOD FOR CONTROLLING A NON-VOLATILE DYNAMIC RANDOM ACCESS MEMORY

BACKGROUND OF INVENTION

1. Field of Invention

The present invention relates to a memory device, and more particularly, to a memory device for storage of both volatile data and non-volatile data.

2. Description of the Prior Art

Recently, along with increasing market demand for portable digital products, technologies and applications of flash memory have matured. These portable digital products include digital cameras, cellular phones, video game consoles, personal digital assistants, answering machines, and programmable ICs. Flash memory is a nonvolatile memory that stores data by changing a threshold voltage of a transistor storage unit to control a turn-on and turn-off of a conductive channel. This mechanism keeps the data stored in the memory from disappearing due to absence of power. Generally speaking, flash memory is recognized as a special structure of conventional electrically erasable and programmable read only memory (EEPROM).

FIG. 1 shows a structure diagram of a conventional flash memory 10. Flash memory 10 comprises a substrate 12, a source 14, a drain 16, a floating gate 18, and a control gate 20. The floating gate 18 and a channel 22 in the substrate 12 are isolated by an oxide layer 24, while the control gate 20 and the floating gate 18 are isolated by an oxide layer 25. The substrate 12 is connected to a reference voltage Vbb (conventionally, ground is used as the reference voltage). If the flash memory 10 is an N-type metal-oxide semiconductor (MOS) structure, then the substrate 12 is p-doped, and the source 14 and the drain 16 are n-doped. On the contrary, if the flash memory 10 is a P-type MOS structure, then the substrate 12 is n-doped, and the source 14 and the drain 16 are p-doped. Please note, for simplicity there is only one memory cell 26 shown in FIG. 1. In general, the flash memory 10 comprises multiple memory cells 26 arranged in an array and addressed by row and column for use as data storage.

The operation of the flash memory 10 is described in detail as follows. A control voltage Vcg inputted to the control gate 20 can change the amount of electrons stored on the floating gate 18, and further change the threshold voltage corresponding to the forming of the channel 22. Therefore, when reading data, the memory cell 26 distinguishes the two data statuses "0" and "1" by determining the amount of electrons stored on the floating gate 18. The two different data statuses are formed either by driving electrons in the channel 22 through the oxide layer 24 into the floating gate 18 to increase the amount of electrons stored in the floating gate 18, or by expelling the electrons stored in the floating gate 18, respectively. As a result, the threshold voltage is relatively high when there are more electrons stored in the floating gate 18, and the threshold voltage is relatively low when there are fewer electrons stored in the floating gate 18. In order to electrically connect the source 14 and the drain 16 of the memory cell 26, i.e. to form the channel 22, the control voltage Vcg is inputted to the control gate 20 to adjust the influence of the threshold voltage of the floating gate 18 at the channel 22. The data status ("0" or "1") in the memory cell 26 under the external control voltage Vcg is determined by reading the current value flowing between the source 14 and the drain 16.

FIG. 2 shows a distribution plot of the threshold voltage of the memory cell 26 of FIG. 1. The distribution plot of FIG. 2 shows amount of the memory cells plotted against threshold voltage. For example, when a binary value "1" is to be stored in the memory cell 26, the memory cell 26 needs to be programmed such that the floating gate 18 will store more electrons and have a higher threshold voltage. For different memory cells 26, those which have "1" stored in them will not have the same threshold voltage, but will form a distribution like curve 28, more specifically they will have threshold voltages ranging from V11 to V12. On the contrary, when a binary value "0" is to be stored in the memory cell 26, the memory cell 26 needs to be erased such that that floating gate 18 will store fewer electrons and have a lower threshold voltage. For different memory cells 26, those which have "0" stored in them will not have the same threshold voltage, but will form a distribution like curve 30, more specifically they will have threshold voltages ranging from −V21 to −V22. Therefore, if a voltage between V11 and −V21 is inputted to every memory cell 26 of the flash memory 10, those with "0" stored in them will be turned on, and those with "1" will not be turned on. The binary data can be read according to the turn-on status through an external circuit, such as a sensing amplifier. Please note, the curves 28, 30 of the threshold voltage distribution are determined by the amount of electrical charge on the floating gate 18, which means the curves 28 and 30 show the positive threshold voltage distribution as well as the negative threshold voltage distribution.

In order to program and erase the flash memory 10, the amount of electrons stored on the floating gate 18 has to be controlled. To do so, methods such as Fowler-Nordheim tunneling or hot electron injection are usually used. Take Fowler-Nordheim tunneling for example, a control voltage Vcg of 10 volts is inputted to the control gate 20, a drain voltage Vd of 5 volts is applied to the drain 16, and a source voltage Vs of 0 volts is applied to the source 14. When electrons move from the source 14 to the drain 16 through the channel 22, an electrical field formed between the control gate 20 and the source 14 and an electrical field formed between the source 14 and the drain 16 pull the electrons towards the floating gate 18. While in hot electron injection, a potential difference between the source 14 and the drain 16 is applied at the same time a positive voltage is inputted to the control gate 20. The potential difference produces high energy electrons in the channel 22, and these high energy electrons further break electron bonding of surrounding atoms to give out more free electrons through an avalanche effect. Finally, the positive voltage at the control gate 20 draws the electrons in the channel 22 towards the floating gate 18.

Nevertheless, when compared to other memory devices, such as a dynamic random access memory (DRAM) with an access time of 1 ns, the charging and discharging of the floating gate 18 of the flash memory 10 is relatively quite slow and generally has an access time in the order of milliseconds. As mentioned above, when processing "read" commands, the flash memory 10 passes a voltage to the control gate 20 and determines the binary data stored by reading the correspondent output current or voltage. Since this does not involve the procedure of driving electrons to the floating gate 18, the flash memory 10 can read as fast as DRAM. However, when processing "write" commands, the above procedure of driving electrons to the floating gate 18 is involved. This drags down the performance of the flash memory 10 and limits the application potential of a flash memory 10 in a rapid read-write environment. Nevertheless, for a conventional DRAM, data stored is volatile, so it is necessary for the DRAM to refresh periodically in order to retain the stored data. It is also expected that the stored data will be lost if the power is cut. Even though the conventional DRAM has an extremely high reading and writing speed, it is not able to store nonvolatile data without an external power supply.

SUMMARY OF INVENTION

It is therefore a primary objective of the claimed invention to provide a nonvolatile memory that has the function of volatile data storage to solve the above-mentioned problem.

According to the claimed invention, a nonvolatile memory comprises a plurality of memory cells, each of which having a substrate, a storage unit positioned on the substrate for storing data, a control unit positioned on the substrate, and a parasitic capacitor between the control unit and the storage unit. The storage unit comprises a floating gate for storing charges and a control gate for receiving an operational voltage to induce a conductive channel on the surface of the substrate. The storage unit is affected by establishment of the conductive channel. The conductive channel is related to a total number of charges stored on the floating gate.

According to the claimed invention, a control method applies a first predetermined voltage to the control unit, and then measures a voltage shift of the first predetermined voltage to determine data stored in the storage unit after the first predetermined voltage is passed through the parasitic capacitor.

These and other objectives of the claimed invention will no doubt become obvious to those of ordinary skill in the art after reading the following detailed description of the preferred embodiment that is illustrated in the various figures and drawings.

DETAILED DESCRIPTION

Figure 3:
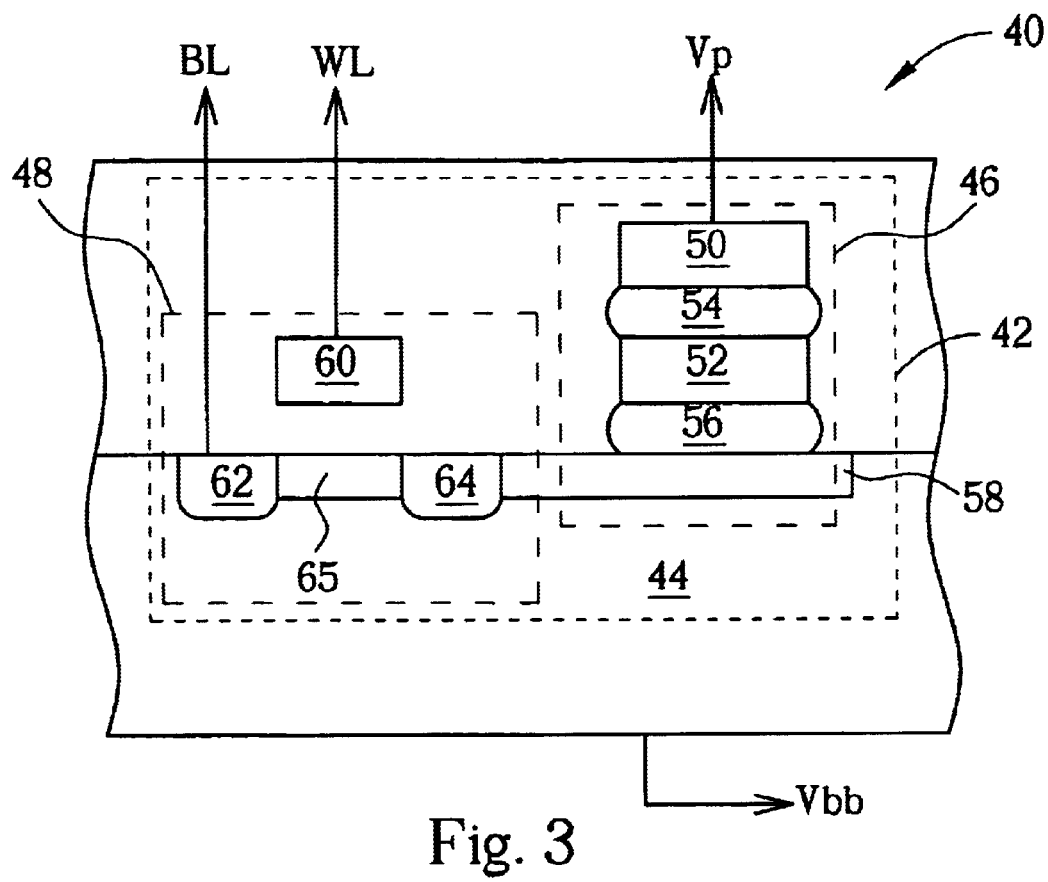
FIG. 3 is a structure diagram of a non-volatile dynamic random access memory according to the present invention.
Figure 4:
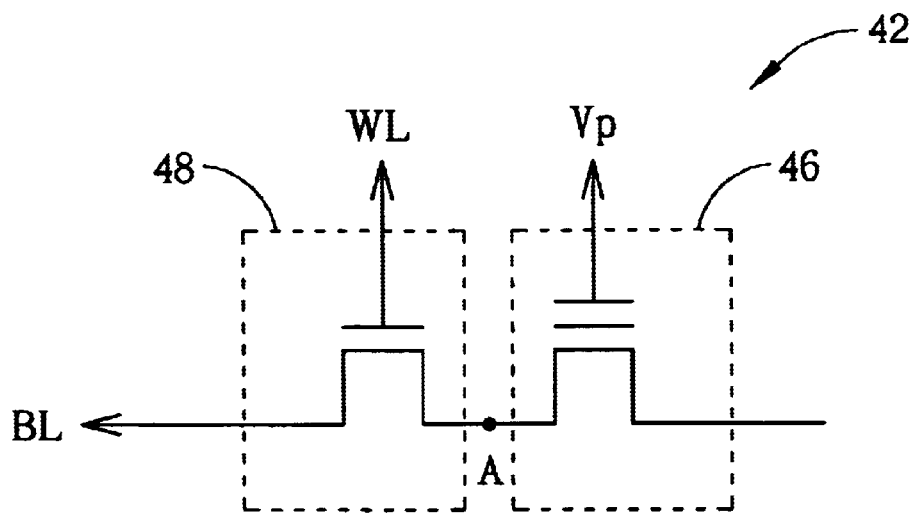
FIG. 4 is a first circuit diagram of the memory cell shown in FIG. 3.
Figure 5:
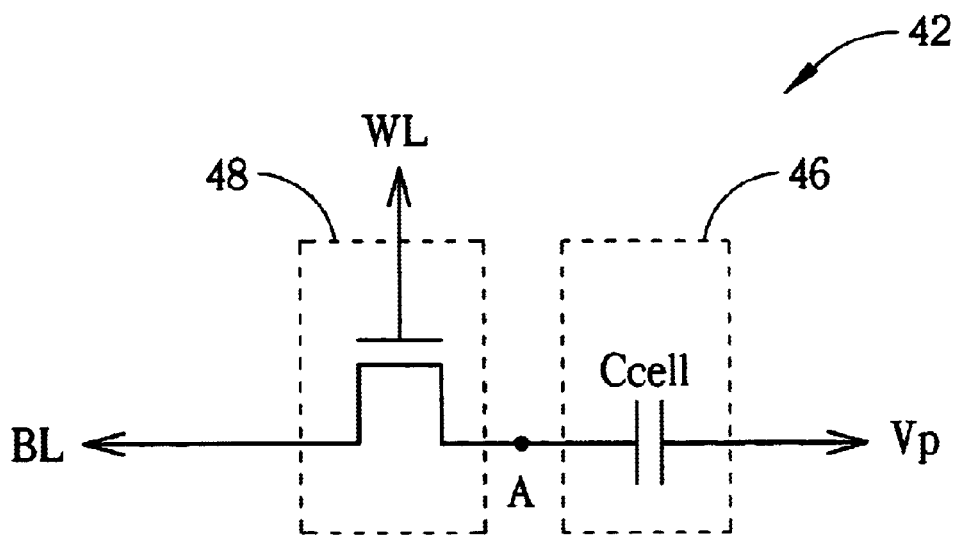
FIG. 5 is a second circuit diagram of the memory cell shown in FIG. 3.

Please refer to FIG. 3, FIG. 4, and FIG. 5. FIG. 3 shows a structure diagram of a non-volatile dynamic random access memory 40 according to present invention. FIG. 4 is a first circuit diagram of a memory cell 42 shown in FIG. 3, and FIG. 5 is a second circuit diagram of the memory cell 42 shown in FIG. 3. The non-volatile dynamic random access memory 40 comprises multiple memory cells 42, which are used for data recording by storing binary values. In FIG. 3 only one memory cell 42 is shown for simplicity. The memory cell 42 comprises a substrate 44, a storage unit 46, and a control unit 48. The storage unit 46 comprises a control gate 50, a floating gate 52, a first oxide layer 54, and a second oxide layer 56. The floating gate 52 is a poly-silicon layer that is a conductor. The first oxide layer 54 is used for isolating the control gate 50 from the floating gate 52, while the second oxide layer 56 is used for isolating the floating gate 52 from the substrate 44. The floating gate 52 is used for storing charges in order to change a threshold voltage corresponding to a channel 58 in the substrate 44. The control gate 50 can control the threshold voltage of the correspondent floating gate 52 through a voltage Vp to determine the formation of the channel 58 in the substrate 44. The substrate 44 is electrically connected to a voltage Vbb. When the channel 58 is formed, the storage unit 46 will be electrically connected to the control unit 48. The control unit 48 is a MOS transistor that comprises three electrodes 60, 62, and 64. The first electrode 60 is a gate, which is connected to a word line WL, and the other electrodes 62 and 64 are a drain and a source respectively according to direction of current flow in the control unit 48. In this example, the electrodes 62 and 64 are n-doped, while the substrate is p-doped. In addition, the second electrode 62 is connected to a bit line BL.

As shown in FIG. 4, a voltage inputted from the word line WL to the first electrode 60 of the control unit 48 will affect the on-off status of the control unit 48, i.e. the formation of a channel 65. When the memory cell 42 is selected, the control unit 48 will be turned on and a node A will be connected to the bit line BL. As a result, the storage unit 46 can be accessed through the bit line BL. However, when the memory cell 42 is not selected, the voltage level on the word line WL is not sufficient to turn on the control unit 48, and the storage unit 46 cannot be accessed through the bit line BL. The structure of the memory cell 42 implies the existence of certain amount of parasitic capacitance, which is equivalent to a memory cell capacitance Ccell, as shown in FIG. 5. When the control gate 50 receives the voltage Vp with a value that is large enough to form the channel 58 in the substrate 44, the storage unit 46 will be electrically connected to the control unit 48 due to the formation of the channel 58. Meanwhile, the equivalent parasitic capacitance increases because the number of the connected elements increases, which means the memory cell capacitance Ccell will have a larger value. While when the storage unit 46 is not electrically connected to the control unit 48, the memory cell capacitance Ccell will have a relatively smaller value.

Figure 1:
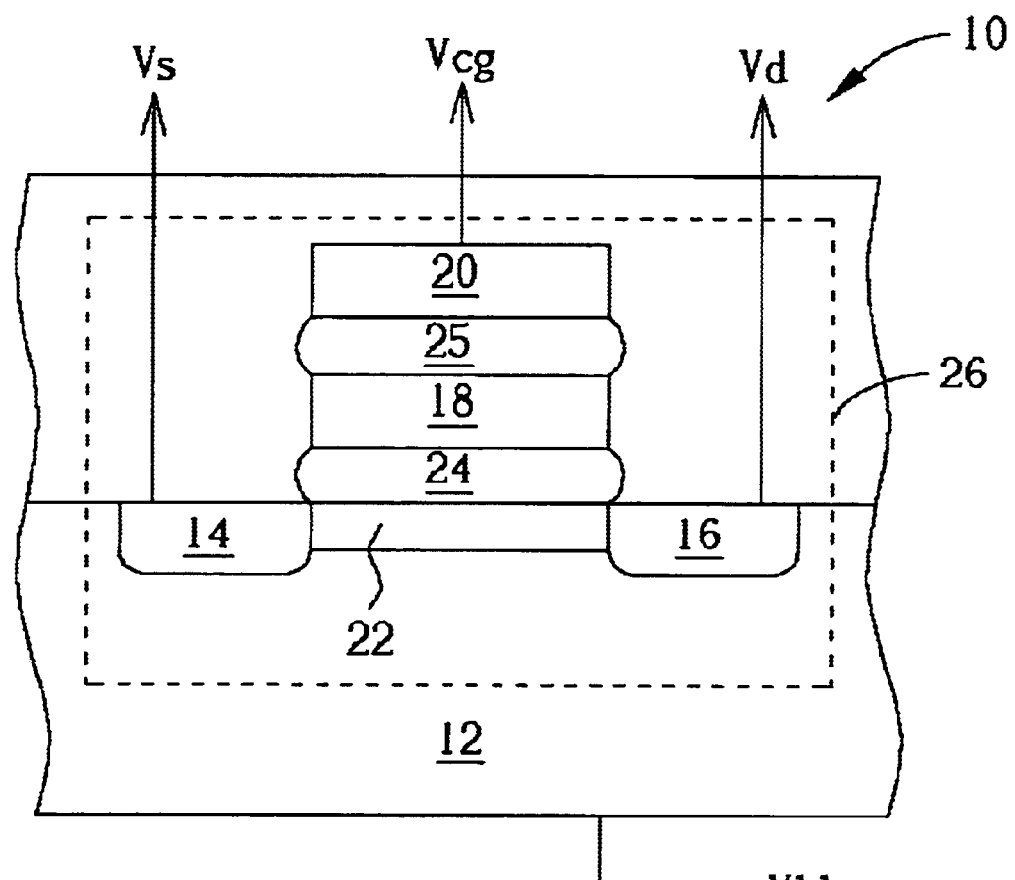
FIG. 1 is a structure diagram of a flash memory according to the prior art.
Figure 2:
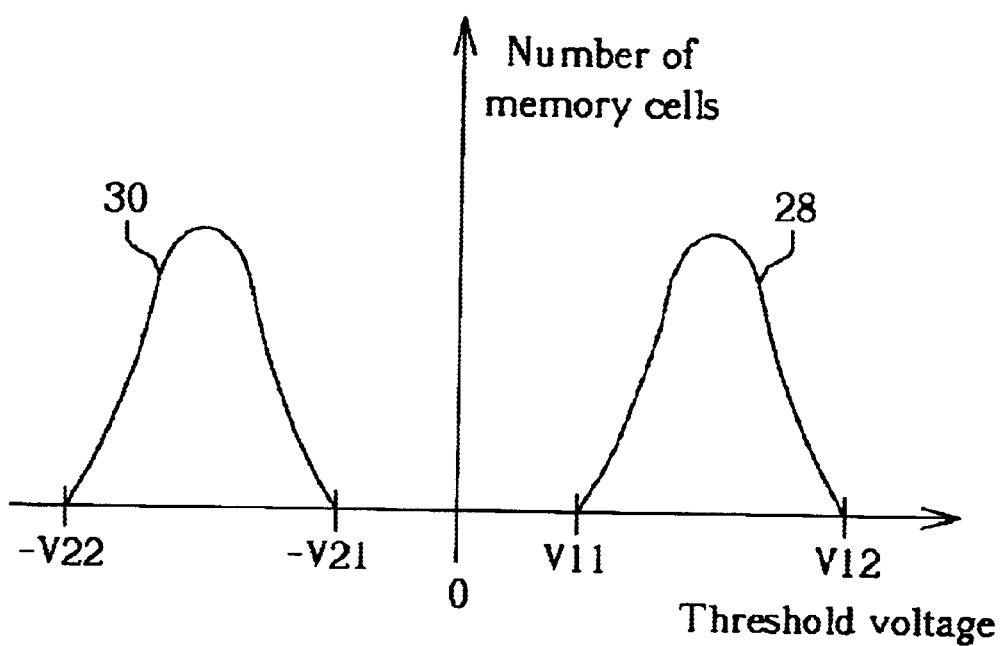
FIG. 2 is a distribution plot of threshold voltage of the memory cell shown in FIG. 1.

The operating mechanism of the non-volatile dynamic random access memory 40 is described in more detail as follows. The non-volatile dynamic random access memory 40 can store non-volatile data utilizing the memory cell 42. Similar to the flash memory 10 of FIG. 1, the non-volatile dynamic random access memory 40 stores electrons through the floating gate 52 to represent correspondent non-volatile data. Since the floating gate 52 is surrounded by the first oxide layer 54 and the second oxide layer 56 and is isolated from the control gate 50 and the substrate 44, electrons stored in the floating gate 52 will be secured from disappearing and the correspondent binary value "0" or "1" will be preserved in the floating gate 52 when the power supply to the non-volatile dynamic random access memory 40 is cut. When a device using the non-volatile dynamic random access memory 40 boots, the non-volatile dynamic random access memory 40 will first read the non-volatile data from the storage unit 46. As shown in FIG. 2, the storage unit 46 storing "0" and that storing "1" will have different threshold voltage distribution characteristics (curves 28, 30).

Figure 6:
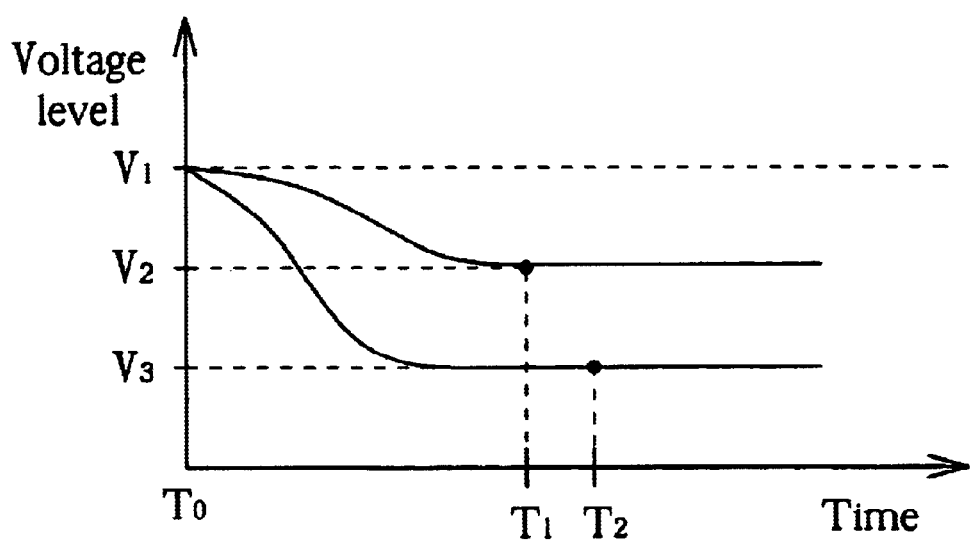
FIG. 6 is a voltage level diagram of the bit line shown in FIG. 3.

Please refer to FIG. 2, FIG. 5, and FIG. 6. FIG. 6 shows a voltage level diagram of the bit line BL shown in FIG. 3. First, a voltage is passed through the word line WL to the first electrode 60 to turn on the control unit 48. Therefore, the bit line BL will be electrically connected to the node A through the channel 65. If "1" is stored in the storage unit 46, the storage unit 46 will have a relatively high threshold voltage (between V11 and V12). Meanwhile, a smaller value of the memory cell capacitance Ccell will be produced due to fewer parasitic capacitors between the storage unit 46 and the control unit 48. When the word line WL inputs a voltage to the first electrode 60 of the control unit 48 in order to turn on the control unit 48, the bit line BL will be electrically connected to the memory cell capacitance Ccell through the channel 65 and the third electrode 64. At this moment, the remaining charges within the bit line BL and the memory cell capacitance Ccell will redistribute between the bit line BL and the memory cell capacitance Ccell. Therefore, if the original voltage level of the bit line BL is V1, then, starting from a time T0 when the bit line BL is electrically connected to the memory cell capacitance Ccell, the voltage level of the bit line BL will drop, and will reach a new voltage level V2, which is the same as that of the memory cell capacitance Ccell at a time T1. Similarly, if "0" is stored in the storage unit 46, the storage unit 46 will have a relatively low threshold voltage (between −V21 and −V22). A larger value of the memory cell capacitance Ccell will be produced due to more parasitic capacitors between the storage unit 46 and the control unit 48. When the word line WL inputs a voltage to the first electrode 60 of the control unit 48 in order to turn on the control unit 48, the bit line BL will be electrically connected to the memory cell capacitance Ccell through the channel 65 and the third electrode 64. At this moment, the remaining charges within the bit line BL and the memory cell capacitance Ccell will redistribute between the bit line BL and the memory cell capacitance Ccell. Therefore, if the original voltage level of the bit line BL is V1, then, starting from the time T0 when the bit line BL is electrically connected to the memory cell capacitance Ccell, the voltage level of the bit line BL will drop, and will reach a new voltage level V3, which is the same as that of the memory cell capacitance Ccell at a time T2. By the mechanism described above, according to the different data stored in the storage unit 46, the bit line BL will be electrically connected to the memory cell capacitance Ccell and produce different levels of potential variation. By measuring this potential variation the correspondent binary value "0" or "1" can be determined.

Afterwards, the voltage level at the node A (or the third electrode 64) will be further adjusted according to the read binary value "0" or "1". First, a voltage larger than the threshold voltage V12 shown in FIG. 2 is inputted into each memory cell 42. Because the amount of electrical charge stored in the floating gate 52 of the storage unit 46 is reflected by the threshold voltage distribution represented by the curves 28, 30 in FIG. 2, a voltage larger than the threshold voltage V12 will induce the channel 58 in the substrate 44 of each memory cell 42, where the channel 58 is correspondent to the status of the storage unit 46. In other words, because each memory cell 42 in the non-volatile dynamic random access memory 40 has a similar parasitic capacitor configuration, each memory cell 42 will have a memory cell capacitance Ccell approaching a predetermined capacitance value. Then, according to the binary value "0" or "1" read from the storage unit 46 earlier, the voltage at the node A will be driven to a second predetermined voltage (for example Vcc volts) or a third predetermined voltage (for example 0 volts). Here the second predetermined voltage represents the binary value "1", and the third predetermined voltage represents the binary value "0".

In summary, first the data is stored in the memory cell 42 in a non-volatile fashion through the amount of electrical charge stored in the floating gate 52, then the data is read from the storage unit 46 and is represented by the voltage level in the correspondent parasitic capacitors, i.e. the data is stored in a volatile fashion. Through the mechanism described above, the non-volatile dynamic random access memory 40 will be able to access the stored volatile data rapidly like a conventional DRAM through the status of the voltage level at the node A, i.e. through the amount of the electrical charge stored in the memory cell capacitance Ccell. For example, when writing the data, a voltage is first inputted from the word line WL to turn on the control unit 48. Then, according to the data being "1" or "0" the second predetermined voltage (Vcc volts) or the third predetermined voltage (0 volts) will be inputted through the bit line BL, and the voltage level at the node A will approach the second predetermined voltage or the third predetermined voltage through the charging and discharging processes of the memory cell capacitance Ccell. When reading the data, a voltage is first inputted from the word line WL to turn on the control unit 48. Then a first predetermined voltage (for example ½ Vcc) will be inputted from the bit line BL. If "1" is stored in the memory cell 42, meaning the voltage level at node A is the second predetermined voltage (Vcc volts), the first predetermined voltage will discharge the memory cell capacitance Ccell and lower the voltage level at the node A. If "0" is stored in the memory cell 42, meaning the voltage level at node A is the third predetermined voltage (0 volts), the first predetermined voltage will charge up the memory cell capacitance Ccell and raise the voltage level at the node A. Therefore, the stored data can be determined by detecting and judging the variation of the voltage level at the node A.

According to above-mentioned description, the non-volatile dynamic random access memory 40 inputs a higher voltage into the control gate 50 in order to eliminate the influence of the electrical charges stored on the floating gate 52 to the threshold voltage forming the channel 58. So no matter how much electrical charge is stored on the floating gate 52, a channel 58 in the substrate 44 will be formed and electrically connected to the control unit 48. The memory cell capacitance Ccell, composed of parasitic capacitors of each memory cell 42, will approach a certain identical value and possess the same characteristics. At this moment, the data stored in each memory cell 42 will be transferred to a correspondent voltage level and the voltage level will start to charge or discharge the memory cell capacitance Ccell. Then the volatile data will be stored through the preservation of the voltage level in the memory cell capacitance Ccell. By doing so, the non-volatile data previously stored on the floating gate 52 of the storage unit 46 can be transferred into corresponding volatile data and stored through the preservation of the voltage level in the memory cell capacitance Ccell. Additionally, a refresh circuit (not shown in the figures) is needed to connect to the non-volatile dynamic random access memory 40. The refresh circuit is used to periodically refresh the data stored in the non-volatile dynamic random access memory 40 in order to prevent the potential loss-or error of the volatile data due to reasons such as charge leakage of the memory cell capacitance Ccell.

When shutting down a device utilizing the non-volatile dynamic random access memory 40, the volatile data must be transferred to corresponding non-volatile data in order to prevent data loss due to the power supply being cut. Therefore, the non-volatile dynamic random access memory 40 will retrieve the non-volatile data stored by the amount of electrical charge on the floating gate 52 of the storage unit 46 from the volatile data stored in the memory cell capacitance Ccell. In other words, the non-volatile dynamic random access memory 40 will execute "erase" and "program" commands to write the data back to the memory cell 42. For example, when executing the "erase" command, the control gate 50 will receive a positive voltage Vp and the substrate 44 will be electrically connected to a negative voltage. Meanwhile, a negative voltage is inputted from the bit line BL to the second electrode 62, and the word line WL is connected to ground (0 volts). Therefore, the potential difference between the control gate 50 and the third electrode 64 along with that between the control gate 50 and the substrate 44 will drive the electrons onto the floating gate 52, and thus "1" will be stored. When executing the "program" command, for the selected memory cell 42, the control gate 50 will receive a negative voltage Vp, and the substrate will be electrically connected to ground. Meanwhile, a positive voltage is inputted from the bit line BL to the second electrode 62, and the word line is connected to a positive voltage. Accordingly, the control unit 48 will turn on, and the potential difference between the control gate 50 and the third electrode 64 along with that between the control gate 50 and the substrate 44 will drive the electrons stored on the floating gate 52 into the third electrode 64, and thus "0" is stored in the storage unit 46.

For the unselected memory cell 42, its control gate 50 will receive a negative voltage Vp and the substrate 44 will be connected to ground. Meanwhile, ground voltage is inputted from the bit line BL to the second electrode 62, and the word line WL is connected to a negative voltage. Therefore, the control unit 48 will not turn on, and the potential difference between the control gate 50 and the third electrode 64 along with that between the control gate 50 and the substrate 44 will be not enough to drive the electrons stored on the floating gate 50 into the third electrode 64, and thus "1" from previous "erase" command will remain in the storage unit 46. Besides, as mentioned above, when executing "erase" command, a block erase result can be achieved by electrically connecting the control gates 50 of a plurality of memory cells 42. Since the electrons generated at the substrate 44 due to the potential difference between the control gate 50 (a positive voltage) and the substrate 44 (a negative voltage) will be accumulated on the floating gates 52 of the plurality of memory cells 42 at the same time, the plurality of memory cells 42 can be stored with "1" and finish "erase" command at the same time. Moreover, other voltage combinations can also be applied to this example for executing "erase" and "program" commands. For example, when executing "erase" command, the control gate 50 will receive a negative voltage Vp. Meanwhile, the bit line BL, the word line WL, and the substrate 44 will be electrically connected to ground or a positive voltage. Accordingly, the control unit 48 will not turn on, and the potential difference between the control gate 50 and the substrate 44 will drive away the electrons stored on the floating gate 52, and thus "1" will be stored in the storage unit 46. When executing the "program" command, for the selected memory cell 42, the control gate 50 will receive a positive voltage Vp, and the substrate 44 will be electrically connected to a negative voltage. Meanwhile, a negative voltage is inputted from the bit line BL to the second electrode 62, and the word line is connected to a positive voltage. Accordingly, the control unit 48 will turn on, and the potential difference between the control gate 50 and the third electrode 64 along with that between the control gate 50 and the channel 58 will drive the electrons onto the floating gate 52, so "0" is stored in the storage unit 46.

In addition, for the unselected memory cell 42, two different voltage combinations are seen to work. One is to set the voltage Vp to positive while the substrate 44 is electrically connected to a negative voltage. Meanwhile, the ground voltage is inputted through the bit line BL to the second electrode 62, and the word line WL is connected to a positive voltage. The other is to set the voltage Vp to ground while the substrate 44 is electrically connected to a negative voltage. Meanwhile, a negative voltage is inputted through the bit line BL to the second electrode 62, and the word line WL Is connected to a positive voltage. Both these two voltage combinations can turn on the control unit 48, but the potential difference between the control gate 50 and the third electrode 64 along with that between the control gate 50 and the channel 58 are not sufficient to draw electrons toward the floating gate 52. So the data stored in the storage unit 46 will remain to be "1" as did before the "erase" command. Please note, in this example, the second electrode 62 is n-doped, and the substrate 44 is p-doped, so the voltage inputted from the bit line BL into the second electrode 62 has to be larger than or equal to the voltage Vbb at the substrate 44 in order to avoid the formation of forward bias between the substrate 44 and the second electrode 62. However, if the memory cell 42 is built on a P-well and the P-well is isolated from the substrate 44 by a N-well, then due to the existence of the P-well and the N-well, the potential difference between the control gate 50 and the substrate 44 must be larger than that mentioned above in order to successfully execute the "erase" and "program" commands. For example when executing the "erase" command, the control gate 50 receives a negative voltage Vp, a positive voltage is inputted to the bit line BL, another positive voltage is inputted to the word line WL, and the substrate 44 is electrically connected to a positive voltage. Then there will be a large enough potential difference between the control gate 50 and the substrate 44 to achieve the driving away of electrons on the floating gate 52.

In this example, if the floating gate 52 is a nonconductive nitride layer, which means the first oxide layer 54, the floating gate 52, and the second oxide layer 56 form an oxide-nitride-oxide (ONO) dielectric structure, it can also achieve the purpose of both non-volatile data and volatile data storage. This is described in more detail as follows. The floating gate 52 of the non-volatile dynamic random access memory 40 is a nonconductive nitride layer that can be used for saving non-volatile data by storing different amount of electrical charge. When turning on a device utilizing the non-volatile dynamic random access memory 40, the non-volatile data stored in the storage unit 46 will be transformed into volatile data, and a correspondent voltage level will be maintained by the memory cell capacitance Ccell (parasitic capacitors) of the memory cell 42. Then the volatile data will be stored in the form of the voltage level corresponding to "0" or "1" by the memory cell capacitance Ccell as in the conventional DRAM. When shutting down the device, the volatile data must be transferred back to non-volatile data to avoid data loss. The non-volatile data is preserved by erasing or by programming the storage unit 46 according to the volatile data stored in the memory cell capacitance Ccell. Since the floating gate 52 of the memory cell 42 shown in FIG. 3 is a conductor, the movement control of electrical charge can be done by the electrical connection between one end of the floating gate 52 and the third electrode 64. However, in this example, the floating gate 52 is a nonconductor and electrical charges are not free to move in the floating gate 52. Therefore, the amount of electrons on the floating gate 52 must be increased or decreased by controlling the potential difference between the control gate 50 and the substrate 44. For example, in FIG. 3, when executing the "erase" command, the control gate 50 receives a negative voltage Vp, the bit line BL, the word line WL, and the substrate 44 are all electrically connected to ground or a positive voltage. As a result, the control unit 48 will not turn on, and the electrons stored on the floating gate 52 will be driven away by the potential difference between the control gate 50 and the substrate 44. Thus, "1" is stored in the storage unit 46.

When executing the "program" command, for the selected memory cell 42, the control gate 50 will receive a positive voltage Vp, and the substrate 44 will be connected to a negative voltage. Meanwhile, a negative voltage is inputted through the bit line BL to the second electrode 62, and a positive voltage is inputted to the word line WL. As a result the control unit 48 will turn on, and the potential difference between the control gate 50 and the channel 58 will drive electrons onto the floating gate 52. Thus, "0" is stored in the storage unit 46. For the unselected memory cell 42, two different voltage combinations are seen to work. One is to input a positive voltage Vp to the control gate 50, and electrically connect the substrate 44 to a negative voltage. The ground voltage is inputted through the bit line BL to the second electrode 62, and a positive voltage is connected to the word line WL. The other is to input a voltage Vp to ground the control gate 50, and electrically connect the substrate 44 to a negative voltage. A negative voltage is inputted through the bit line BL to the second electrode 62, and a positive voltage is connected to the word line WL. Both these two voltage combinations can turn on the control unit 48, but the potential difference between the control gate 50 and the channel 58 is not sufficient to draw electrons toward the floating gate 52. Hence, the data stored in the storage unit 46 will remain to be "1" as did before the "erase" command.

Compared to the prior art, the non-volatile dynamic random access memory according to present invention uses a storage unit to store non-volatile data, and meanwhile stores volatile data by utilizing parasitic capacitors as a memory cell capacitance. The present invention further provides a control unit to control the reading and writing of the non-volatile data stored in the storage unit. The non-volatile dynamic random access memory according to present invention transfers the non-volatile data into a correspondent voltage level (i.e. volatile data) and stores it in the memory cell capacitance. The volatile data stored in the memory cell capacitance can also be transferred into a correspondent amount of electrical charge (i.e. non-volatile data) through executing "erase" and "program" commands, and can be further stored in the storage unit. In summary, the non-volatile dynamic random access memory according to present invention has both the characteristics of high access speed of a volatile memory device, and a long preservation time without refresh of a non-volatile memory device.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A control method of a non-volatile memory, the non-volatile memory comprising a plurality of memory cells, each memory cell comprising:
   a substrate;
   a storage unit positioned on the substrate for storing data, the storage unit comprising:
      a floating gate for storing charges; and
      a control gate for receiving an operational voltage to induce a conductive channel on the surface of the substrate, the conducting channel being related to a total number of charges stored on the floating gate; and
   a control unit positioned on the substrate, a parasitic capacitor between the control unit and the storage unit being affected by establishment of the conducting channel, the control unit is a metal-oxide-semiconductor (MOS) transistor comprising:
      a first electrode for receiving a control voltage to control conductivity of the control unit;
      a second electrode for receiving a first predetermined voltage, a second predetermined voltage, and a third predetermined voltage to adjust charges stored in the parasitic capacitor so that corresponding data represented by amounts of the charges are stored; and
      a third electrode electrically connected to the parasitic capacitor;
   the control method comprising:
      applying a first predetermined voltage to the control unit; and
      measuring a voltage shift of the first predetermined voltage to determine data stored in the storage unit after the first predetermined voltage is passed through the parasitic capacitor.

2. The control method of claim 1 wherein the storage unit further comprises:
   a first oxide layer positioned between the substrate and the floating gate for isolating the substrate from the floating gate; and
   a second oxide layer positioned between the control gate and the floating gate for isolating the control gate from the floating gate.

3. The control method of claim 2 wherein the floating gate is a poly-silicon layer that is a conductor.

4. The control method of claim 2 wherein the floating gate is a nitride layer that is a nonconductor.

5. The control method of claim 1 wherein the first predetermined voltage is less than the second predetermined voltage but greater than the third predetermined voltage.

6. The control method of claim 5 wherein the second predetermined voltage stands for a binary value "1", and the third predetermined voltage stands for a binary value "0".

7. The control method of claim 6 further comprising adjusting a voltage level of the third electrode to approach the second predetermined voltage or the third predetermined voltage according to amounts of charges stored on the floating gate.

8. The control method of claim 7 further comprising:
   passing an input voltage to the control gate of each memory cell for inducing the conductive channel on the surface of the substrate of each memory cell so as to force the parasitic capacitor of each memory cell to approach a predetermined capacitance.

9. The control method of claim 1 further comprising adjusting amounts of charges stored on the floating gate to record the corresponding data according to the voltage shift.

10. The control method of claim 9 further comprising:
    adjusting amounts of the charges stored on the floating gate to be greater than a predetermined storage number if the voltage shift is positive; and
    adjusting amounts of the charges stored on the floating gate to be less than the predetermined storage number if the voltage shift is negative.

11. A control method of a non-volatile memory, the non-volatile memory comprising a plurality of memory cells, each memory cell comprising:

a substrate;

a storage unit positioned on the substrate for storing data, the storage unit comprising:
- a floating gate for storing charges; and
- a control gate for receiving an operational voltage to induce a conductive channel on the surface of the substrate, the conducting channel being related to a total number of charges stored on the floating gate; and a control unit positioned on the substrate, a parasitic capacitor between the control unit and the storage unit being affected by establishment of the conducting channel;

the control method comprising:
- applying a first predetermined voltage to the control unit;
- measuring a voltage shift of the first predetermined voltage to determine data stored in the storage unit after the first predetermined voltage is passed through the parasitic capacitor; and
- adjusting amounts of charges stored on the floating gate to record the corresponding data according to the voltage shift.

12. The control method of claim 11 wherein the floating gate is a nitride layer that is a nonconductor.

13. The control method of claim 11 wherein the control unit is a metal-oxide-semiconductor (MOS) transistor comprising:
- a first electrode for receiving a control voltage to control conductivity of the control unit;
- a second electrode for receiving the first predetermined voltage, a second predetermined voltage, and a third predetermined voltage to adjust charges stored in the parasitic capacitor so that corresponding data represented by amounts of the charges are stored; and
- a third electrode electrically connected to the parasitic capacitor.

14. The control method of claim 13 wherein the first predetermined voltage is less than the second predetermined voltage but greater than the third predetermined voltage.

15. The control method of claim 13 wherein the second predetermined voltage stands for a binary value "1", and the third predetermined voltage stands for a binary value "0".

16. The control method of claim 13 further comprising adjusting a voltage level of the third electrode to approach the second predetermined voltage or the third predetermined voltage according to amounts of charges stored on the floating gate.

17. The control method of claim 11 further comprising passing an input voltage to the control gate of each memory cell for inducing the conductive channel on the surface of the substrate of each memory cell so as to force the parasitic capacitor of each memory cell to approach a predetermined capacitance.

18. The control method of claim 11 further comprising:
- adjusting amounts of the charges stored on the floating gate to be greater than a predetermined storage number if the voltage shift is positive; and
- adjusting amounts of the charges stored on the floating gate to be less than the predetermined storage number if the voltage shift is negative.

19. A control method of a non-volatile memory, the non-volatile memory comprising a plurality of memory cells, each memory cell comprising:

a substrate;

a storage unit positioned on the substrate for storing data, the storage unit comprising:
- a floating gate for storing charges; and
- a control gate for receiving an operational voltage to induce a conductive channel on the surface of the substrate, the conducting channel being related to a total number of charges stored on the floating gate; and a control unit positioned on the substrate; the control method comprising:
- establishing a parasitic capacitor of substantially a predetermined capacitance between the storage unit and the control unit through the application of the operational voltage to the control gate to induce the conductive channel, the operational voltage being large enough to induce the conductive channel regardless of the value stored on the floating gate; and
- utilizing the control unit to store volatile data in the established parasitic capacitor.

20. The control method of claim 19 wherein the control unit is a metal-oxide-semiconductor (MOS) transistor comprising:
- a first electrode for receiving a control voltage to control conductivity of the control unit;
- a second electrode for receiving a second predetermined voltage and a third predetermined voltage to adjust charges stored in the parasitic capacitor so that corresponding data represented by amounts of the charges are stored; and
- a third electrode electrically connected to the parasitic capacitor.

21. The control method of claim 20 wherein the second predetermined voltage stands for a binary value "1", and the third predetermined voltage stands for a binary value "0".

* * * * *